United States Patent [19]
Tang

[11] Patent Number: 5,939,672
[45] Date of Patent: Aug. 17, 1999

[54] HERMETICALLY SEALED ELECTRICAL CONNECTION TO A JUNCTION BOX

[75] Inventor: Danny Q. Tang, Manalapan, N.J.

[73] Assignee: Antronix, Inc., Cranbury, N.J.

[21] Appl. No.: 08/814,491

[22] Filed: Mar. 10, 1997

[51] Int. Cl.⁶ ............................................. H01J 5/00
[52] U.S. Cl. .......................................... 174/50.5; 439/936
[58] Field of Search ............................... 174/50.5, 50.52, 174/76, 77 R; 439/711, 404, 936; 361/826, 728, 736, 752

[56] References Cited

U.S. PATENT DOCUMENTS

| | | | |
|---|---|---|---|
| 4,431,247 | 2/1984 | Adullah et al. ........................ | 439/392 |
| 4,643,924 | 2/1987 | Uken et al. ............................ | 428/35.7 |
| 4,741,709 | 5/1988 | Jervis .................................... | 439/521 |
| 4,859,809 | 8/1989 | Jervis .................................... | 174/92 |
| 4,909,756 | 3/1990 | Jervis .................................... | 439/521 |
| 4,995,829 | 2/1991 | Geib et al. ............................ | 439/409 |
| 5,034,800 | 7/1991 | Marchisi ............................... | 174/52.1 |
| 5,111,001 | 5/1992 | Jervis .................................... | 174/92 |
| 5,149,281 | 9/1992 | Hills et al. ............................ | 439/521 |
| 5,245,507 | 9/1993 | Ericksen .............................. | 174/67 |
| 5,296,646 | 3/1994 | Capper et al. ........................ | 174/51 |
| 5,399,100 | 3/1995 | Dooley et al. ....................... | 439/482 |
| 5,431,758 | 7/1995 | Delalle ................................. | 156/49 |
| 5,442,004 | 8/1995 | Sutherland et al. ................. | 524/140 |
| 5,450,469 | 9/1995 | Pamart et al. ........................ | 379/27 |
| 5,484,304 | 1/1996 | Capper et al. ........................ | 439/409 |
| 5,574,257 | 11/1996 | Brauer et al. ........................ | 174/76 |
| 5,594,210 | 1/1997 | Yabe ..................................... | 174/76 |
| 5,785,548 | 7/1998 | Capper et al. ........................ | 439/409 |

OTHER PUBLICATIONS

AMP, *Material Safety Data Sheet For AMP Part No. 998665–1*, 125–6377, Aug. 1, 1985, Rev. O, pp. 1–5.
AMP, *Material Specification Sealant 20, AMP PN 998665–1*, 100–1306, Nov. 1, 1995, Rev. O, pp. 1–3.

*Primary Examiner*—Nestor Ramirez
*Assistant Examiner*—Joseph Waks
*Attorney, Agent, or Firm*—Watov & Kipnes, P.C.

[57] ABSTRACT

In junction boxes for coupling T.V. signals and low frequency power waves on a coax line to a plurality of users, the T.V. signals are coupled via connections in a first compartment to a plurality of coax cables, and the low frequency power wave are coupled via low pass-filters to IDC connections in a second compartment.

Leads from users are passed through a chamber on the wall of the second compartment containing a self-healing, self-supporting insulating substance and attached to the IDC connectors. The IDC connectors permit the lead to be paired through them so that an installer can know when the leads are properly partitioned.

9 Claims, 21 Drawing Sheets

HERMETICALLY SEALED ELECTRICAL CONNECTION TO A JUNCTION BOX

BACKGROUND OF THE INVENTION

In Cable TV and other RF signal distribution systems, it is usually required to tap off RF energy from a main distribution coaxial cable for subscriber service through a drop feed cable. A known tap off device to accomplishing this is a multi-tap.

A variety of tap values are available in order to deliver the correct signal level to the service drop regardless of signal level in the transmission cable at that particular point in the system.

A multi-tap consists of a removable tap plate and a housing. The tap plate and housing must be installed in the manner to be completely hermetically sealed so that moisture does not penetrate into the device.

When, however, additional services such as those that provide telephone service to a user, the power source to energize the necessary equipment will be provided by the cable system through the same coaxial cable carrying both AC power and the RF signal. Within the tap, an RF signal is tapped off to appropriate RF connectors, which are an integral part of the tap plate. AC power is provided through the IDC (Insulation Displacement Connector) connector terminal inside the tap.

Typically a coaxial cable with an F-Type connector is connected to the tap RF ports to tap off an RF signal to a subscriber TV set, and a pair of wires are connected to the AC connector terminal of the tap to tap off AC power to subscriber equipment.

Thus it is necessary that ends of the leads for carrying power to the user be inserted into the hermetically sealed junction box, but it has been difficult to do this in such manner as to preserve the hermetical seal. For example, such a junction box can be a multi-tap for cable TV. One method has been to simply pass the leads between the cover and the body of the box in the hope that the gasket between them will provide the seal. Unfortunately, however, the gasket material does not flow completely around the leads and therefore cannot provide a hermetic seal. The problem gets worse each time the box is opened. Typically, the leads carry AC power from the multi-tap for example, to a subscriber or user.

Furthermore, connection between a terminal in the junction box and a lead from the special cable that has been inserted into the junction box has heretofore been effected by an IDC connector within the box having a terminal for connection to circuits, a blind input port into which the lead is inserted, and mechanically operable means for cutting through the insulation of the lead so as to connect it to the terminal.

One of the problems encountered is that it has been difficult for a cable installer to know whether or not the connection has been made because of the possibility that the lead is not properly located within the IDC connector. It might, for example, be deflected so as not to reach the position where its insulation will be cut so as to make the desired connection to the terminal. This problem is emphasized by deleterious conditions under which the connection is sometimes made.

SUMMARY OF THE INVENTION

A junction box constructed in accordance with this invention provides a way of introducing leads into it without in any way affecting the excellent seal maintained between its cover and its body regardless of the number of times the cover and power are removed and installed. This is effected by forming a chamber adjacent the outside of the junction box through which insulated leads for power etc., are inserted. Sealing is achieved by a sealant within the chamber that is self-healing, self-supporting and insulating. A sealant suitable for this purpose is available from the Ray Chem Corp. of 300 Constitution Drive, Menlo Park, Calif. 94025, or is available from the AMP Manufacturing Co. as Part No. 990705-1 having a material specification 100-1191 and a process specification 119-2190, for example, Whether insulating material is suitable as a sealant can be determined by placing some in the bottom of a paper cup, filling the cup with water and ramming a sharp instrument such as an ice pick or a wire through the sealant and the bottom of the cup and withdrawing the instrument. If the material is self-healing as required, water will not leak through the bottom of the cup because the hole in the sealant made by the instrument is almost immediately filled. The material must be self-supporting as can be demonstrated by its remaining in the cup when the cup is turned upside down.

With such sealant, a lead can be inserted through the chamber and there will be no aperture through which moisture can pass because the sealant will form an intimate contact with it at all points. Furthermore, the lead can be withdrawn and reinserted many times without causing a leak.

Another distinct advantage is the fact that the IDC (Insulation Displacement Connector) within the junction box has inlet and outlet ports through which a lead can be inserted so that even if the visibility is very poor, a cable installer can tell by feeling the output port of the contact whether a lead is properly installed.

DETAILED DESCRIPTION OF THE INVENTION

Figure 1:
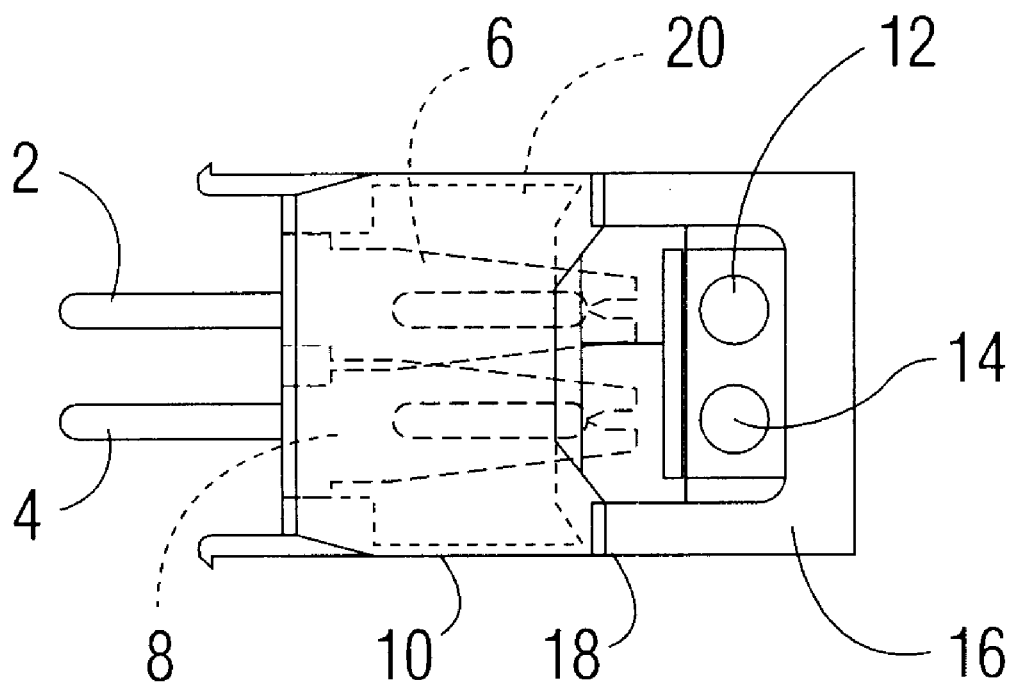
FIG. 1 illustrates a prior art IDC connector.

In the prior art IDC shown in FIG. 1, terminals 2 and 4 are respectively connected to U shaped spades 6 and 8 within an enclosure 10 in which insulated leads to be connected to the terminals 2 and 4 are passed via ports 12 and 14 in a member 16. The member 16 pivots about an axis 18 so that when it is pressed down, leads in the ports 12 and 14 are respectively forced into the spades 6 and 8 that cut through the insulation so as to make contact between the conductors in the leads and the spades 6 and 8. Although not shown, the passageways associated with the ports 12 and 14 are blind, and the spades 6 and 8 are immersed in sealant 20 so that the connections with the leads are protected from air and moisture. The sealant used is the same as is used in this invention.

In discussing the various figures of the drawings, like parts will be designated in the same way.

Figure 2:
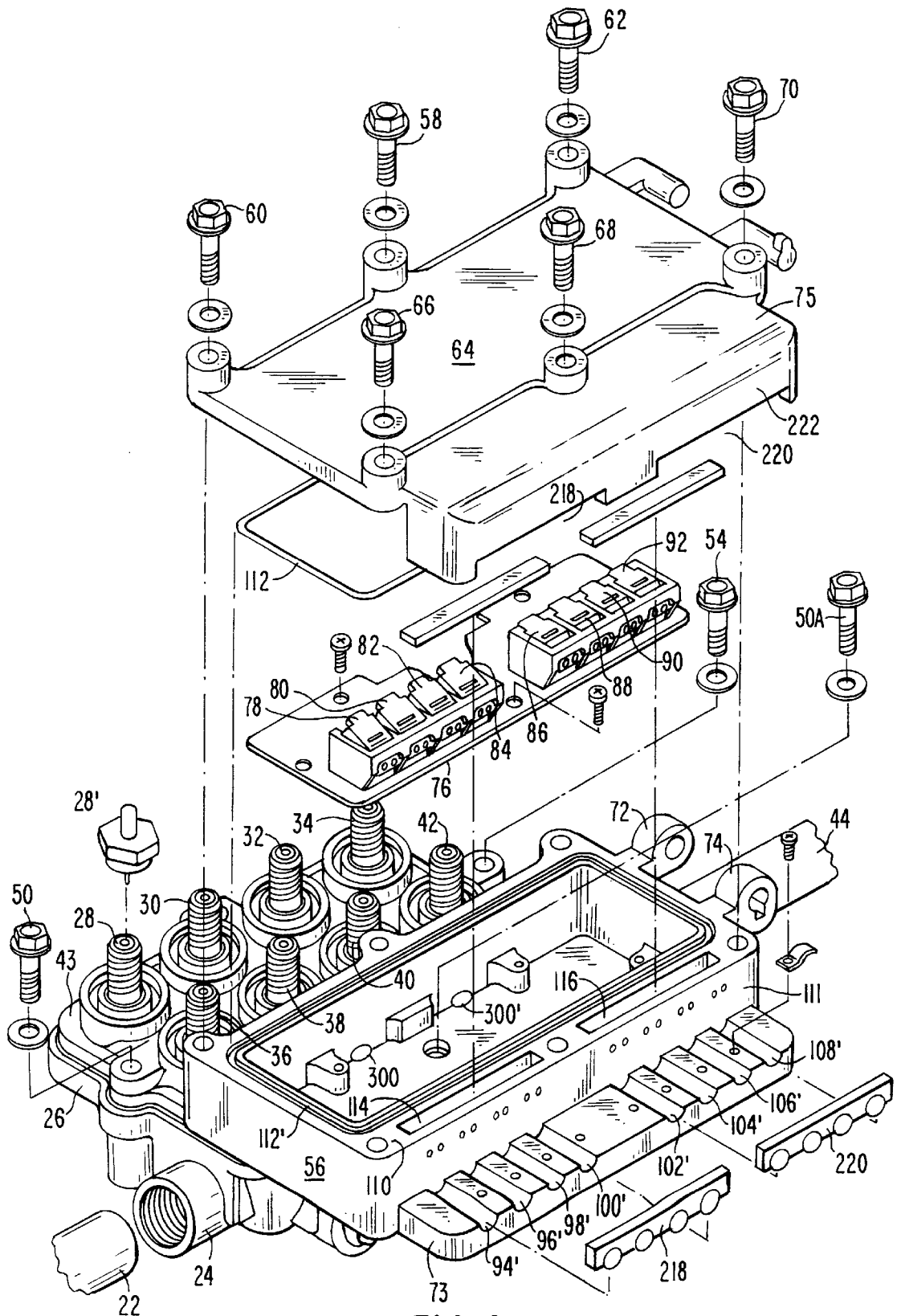
FIG. 2 is an exploded isometric assembly view of a multi-tap assembly looking down on the bottom when installed.
Figure 3:
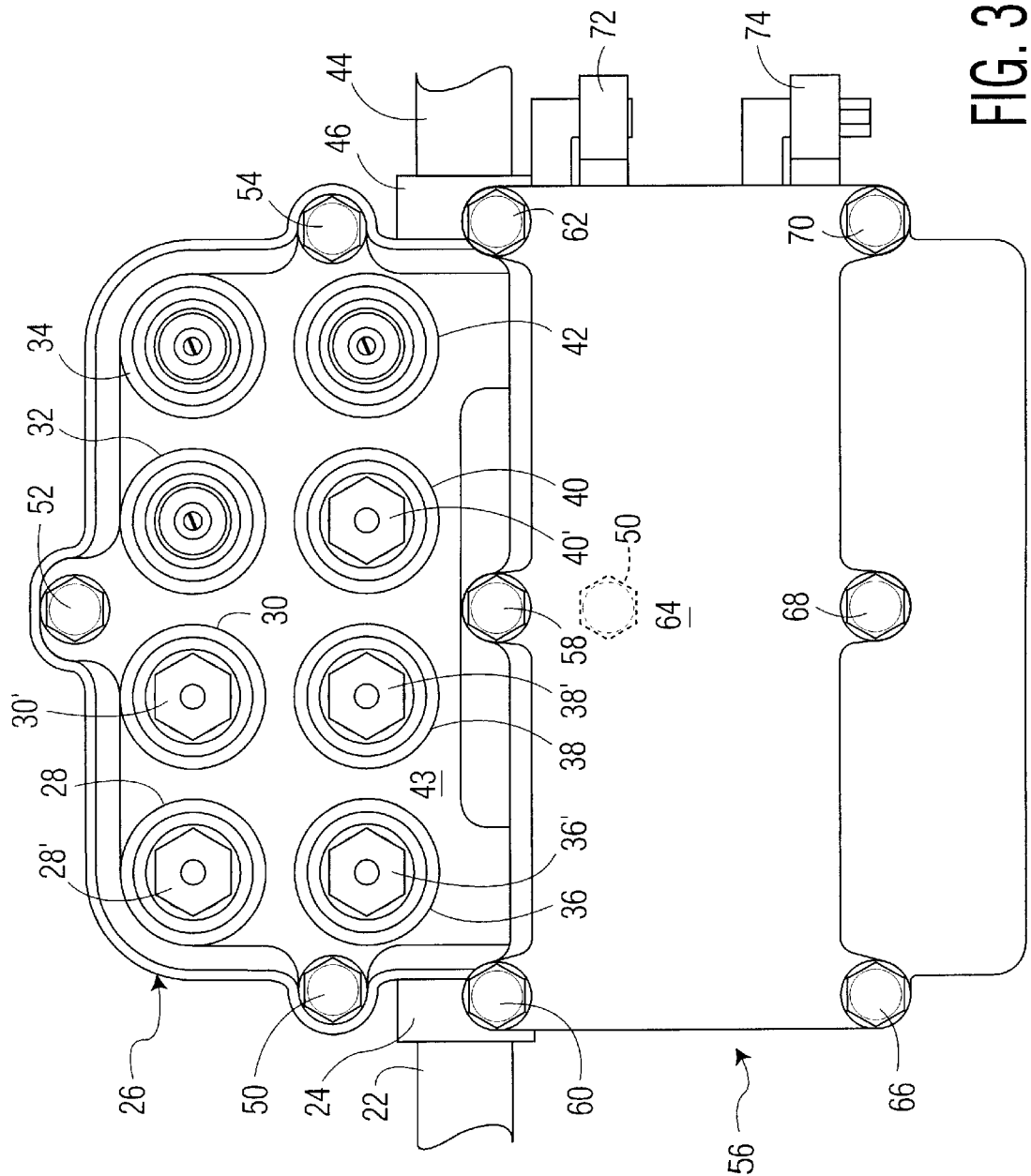
FIG. 3 is a bottom view of the junction box of FIG. 2 of the invention when assembled with its cover closed.

Reference is made to FIGS. 2 and 3, which are bottom views of the junction box when installed. In FIG. 2, an input coaxial cable 22 that carries the TV signals and may carry low frequency AC power is coupled by a coaxial port 24 to the interior of a first closed compartment 26. Circuits within the compartment 26 couple the TV signals on the cable 22 to coaxial connectors 28, 30, 32, 34, 36, 38, 40, and 42 that extend outwardly from the top plate 43 of the compartment 26 and to an output coaxial cable 44 that is coupled to the circuits within the compartment 26 by a coaxial port 46. When not in use, the connectors 28–42 are protected by 75 ohm load terminators such as indicated at 28', 30', 36', 38', and 40' in FIG. 3. Thus TV signals arrive on the input coaxial cable 22 and leave on the output coaxial cable 44. As described in the U.S. patent application entitled "Cable TV Multi-Tap Uninterrupted Signal/Power Throughport", bearing Ser. No. 08/489,726, filed on Jun. 13/95 and assigned to the same assignee as this invention, these TV signals continue to flow between the input cable 22 and the output cable 44 even though work is being done on the circuits within the compartment 26 that otherwise would require their interruption. The top 43 of the compartment 26 is fastened to its bottom by threaded bolts 50, 50A, 52, and 54. The bolt 52 is not shown in FIG. 2, but would be behind the connector 30.

A second compartment 56 is integral with the compartment 26, and threaded bolts 58, 60, 62, 66, 68, and 70 serve to fasten a cover 64 to the compartment 56. When the bolts are not fastened, the cover 64 can be pivoted about hinges 72 and 74. A ledge 73 to which power cables are to be clamped extends outwardly from the bottom of the compartment 56 and is parallel thereto. When the cover 64 is closed, a projection 75 thereof overlies the ledge 73.

Figure 4:
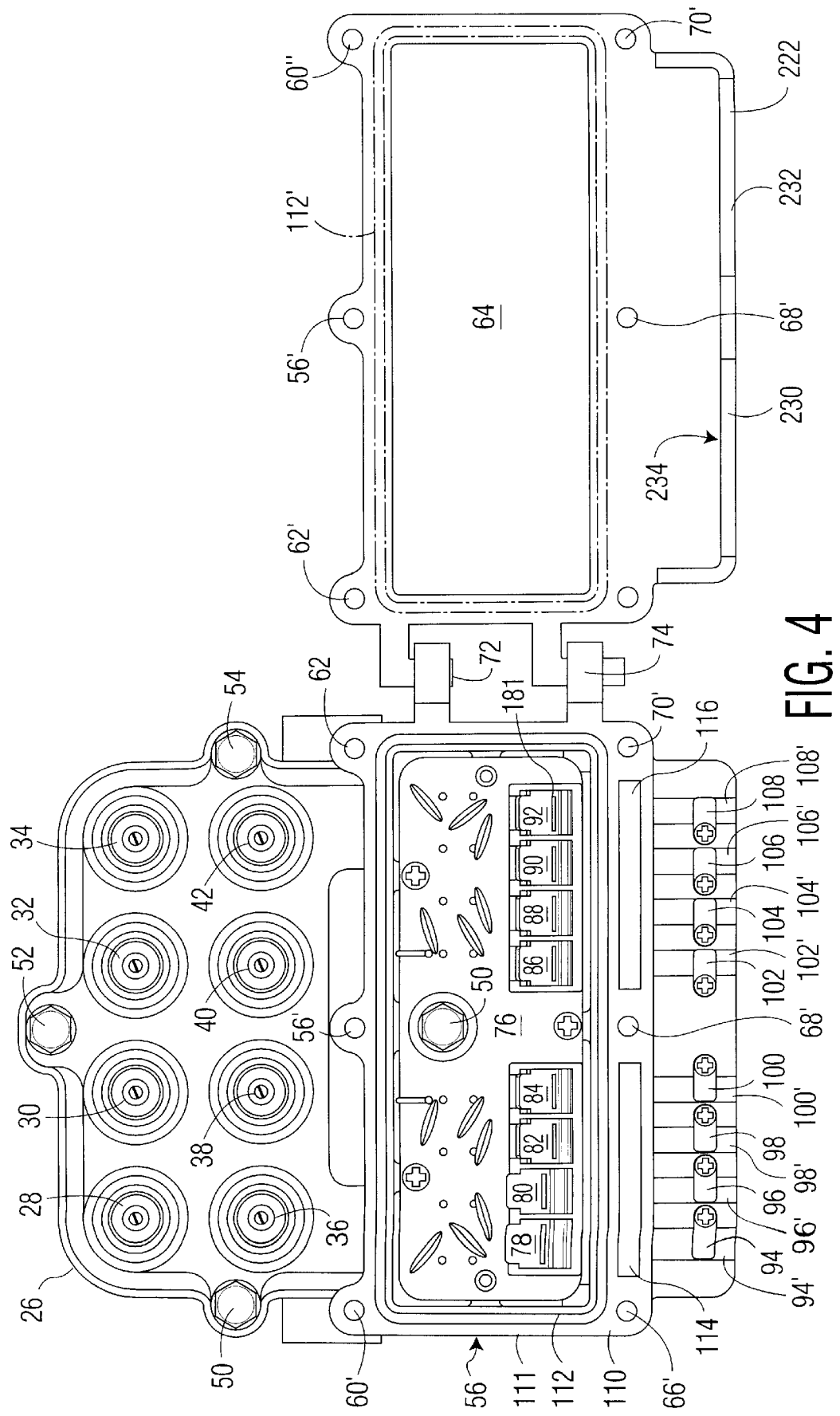
FIG. 4 is a bottom view of the junction box of FIG. 2 of the invention with its cover open.

FIG. 4 shows the bottom of the compartment 56 of FIG. 2 with the cover 64 open so as to reveal a circuit board 76 that is coupled in a manner described below to the coaxial cable 22 through a filter assembly 302 shown in FIG. 20 so as to provide low frequency AC power to terminals, not shown, for IDC connectors 78, 80, 82, 84, 86, 88, 90, and 92. Twisted pairs of insulated leads from a power cable like 128 of FIG. 5 that leads to a user are to be inserted in each of the IDC connectors 78–92 in a manner to be particularly described by reference to FIG. 6. The leads are respectively held by clamps 94, 96, 98, 100, 102, 104, 106, and 108 in the semi-cylindrical grooves indicated by the same numbers primed as will also be explained by reference to FIG.

With the cover 64 open, the top 110 of a side wall 111 of the compartment 56 as well as a gasket 112 within channel 112 extending completely around the top 110 are visible. When the cover 64 is closed, the gasket 112 will be sandwiched between the top 110 and the cover 64. This is necessary in order to provide a tight moisture seal. The bolts 58, 60, 62, 66, 68, and 70 pass through holes in the top 64 and are threaded in holes in the top 110, indicated by the same numbers primed so as to hold the cover 64 in its sealed position when tightened.

Figure 5:
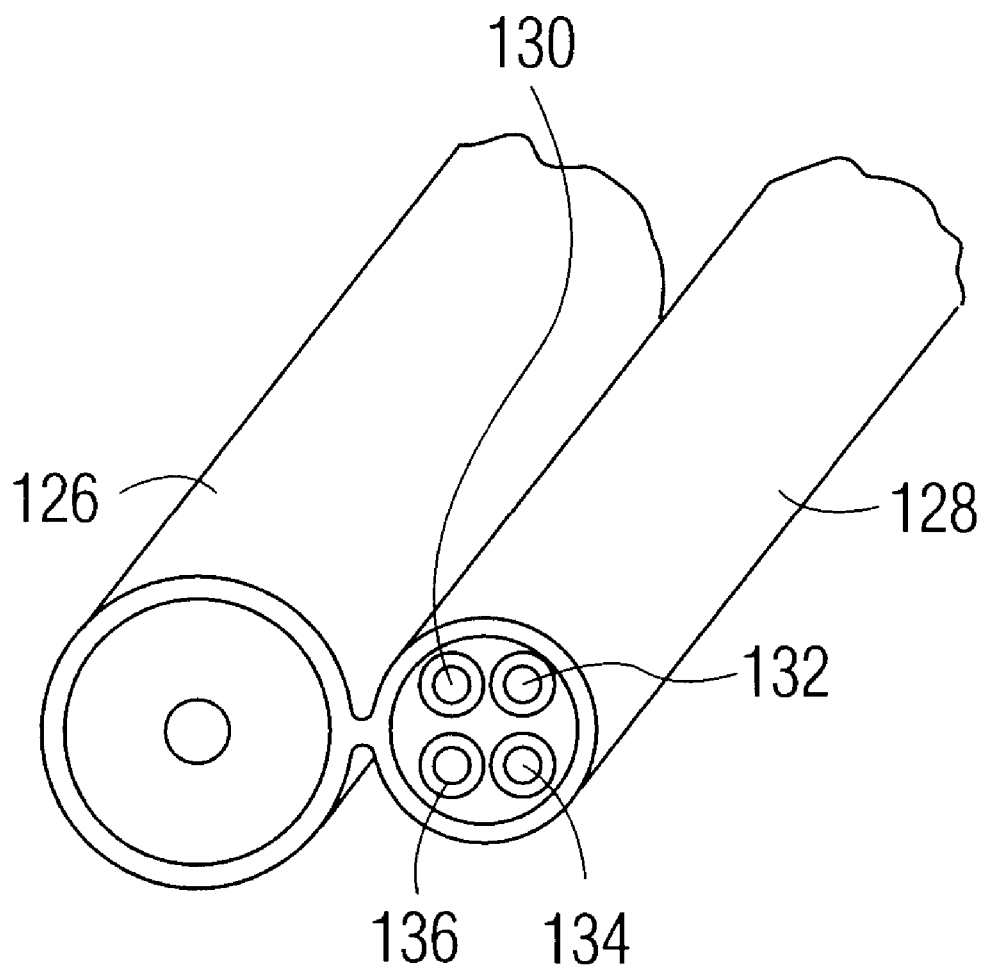
FIG. 5 is a cross-sectional isometric view of a co-joined coaxial cable and four pairs of power cables.

As can be seen, insulated leads carrying the AC power must pass from the IDC connectors 78–92, FIG. 4, that are inside the second compartment 56 to a point outside it i.e., they must pass beyond the side wall 111 to a user via a power cable 128 such as shown in FIG. 5. In order to do this, the previous practice has been to pass them between the gasket 112 and the cover 64, but this has not provided a satisfactory seal.

Figure 6:
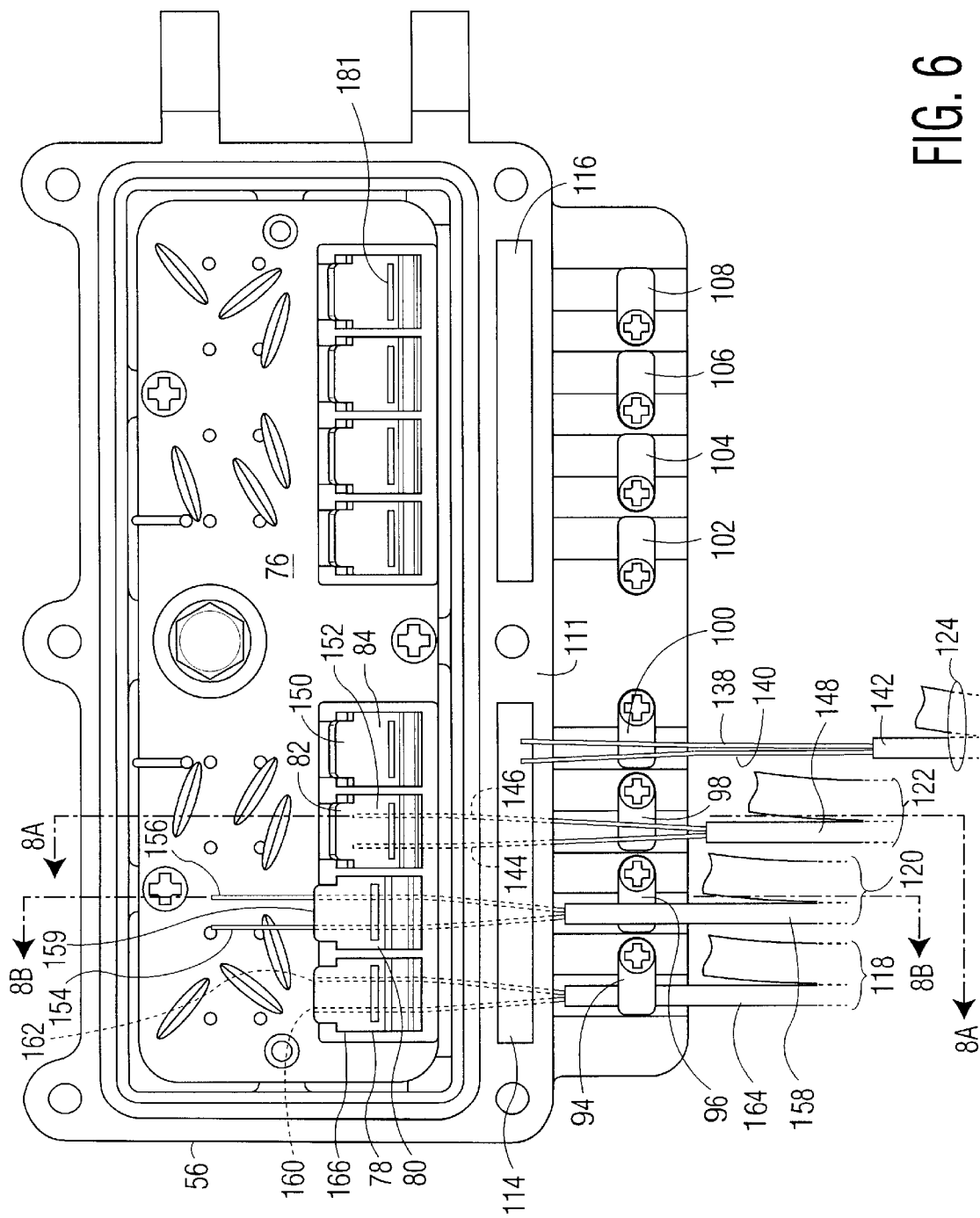
FIG. 6 is a view of a portion of the junction box of the invention of FIG. 2 showing how the leads are inserted through the chamber and into the junction box.

In accordance with this invention, chambers 114 and 116, as seen in FIGS. 2, 4, and 6, are provided adjacent respective portions of the outside of the side wall 111 of the compartment 56 and contain the sealant previously referred to. As shown in FIG. 6, cables 118,120,122, and 124 having cross-sections such as shown in FIG. 5 are brought from a junction box to the users' location. Each of these cables is comprised of a coax cable 126 that is joined to the power cable 128 along their length. Although only one pair of insulated power leads is required for each user, it is customary to provide four leads 130,132, 134, and 136 so as to provide an extra pair that can be used in the event a first pair fails. At the junction box, the ends of the coaxial cables such as 126 and the power cables such as 128 are separated and the coaxial cables are coupled to respective coaxial connectors 28–42 shown in FIGS. 2, 3, and 4.

FIG. 6 illustrates the various positions that insulated leads of a power cable such as 128 will have as they are being installed. Insulated leads 138 and 140 from a power cable 142 have just been cut so as to be ready for insertion. Insulated leads 144 and 146 from a power cable 148 have been passed through the chamber 114 and inserted into respective inlet ports, not shown, in the IDC connector 82. Activating levers 152 and 150 of the IDC connectors 84 and 82 are in the non contact or raised position. Insulated leads 154 and 156 from a power cable 158 have been inserted through the inlet and outlet ports, not shown, of the IDC connector 80, and its lever 159 has been pressed to make electrical contacts between the leads 154 and 156 and their respective terminals. Insulated leads 160 and 162 from a power cable 164 have been cut off by the cable installer and the clamp 94 tightened to hold the power cable 164. The lever 166 of the IDC connector 78 remains closed.

The fact that insulated leads can extend completely through their IDC connector such as the IDC connector 80 in the case of the leads 154 and 156 makes it possible for a cable installer to tell by feel and/or sight when they are in the desired position.

Figure 7A:
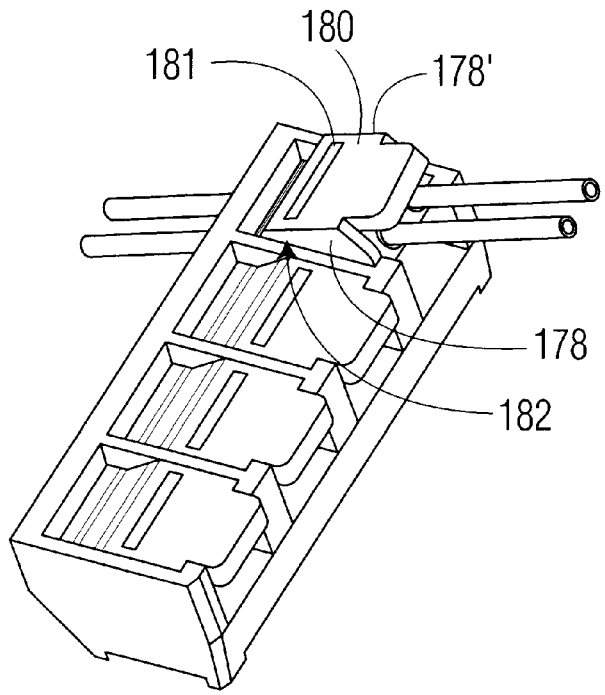
FIG. 7A is an isometric view of an IDC connector in which the inlet and outlet ports are such as to direct the uncut lead upward from a junction box of the invention.
Figure 7B:
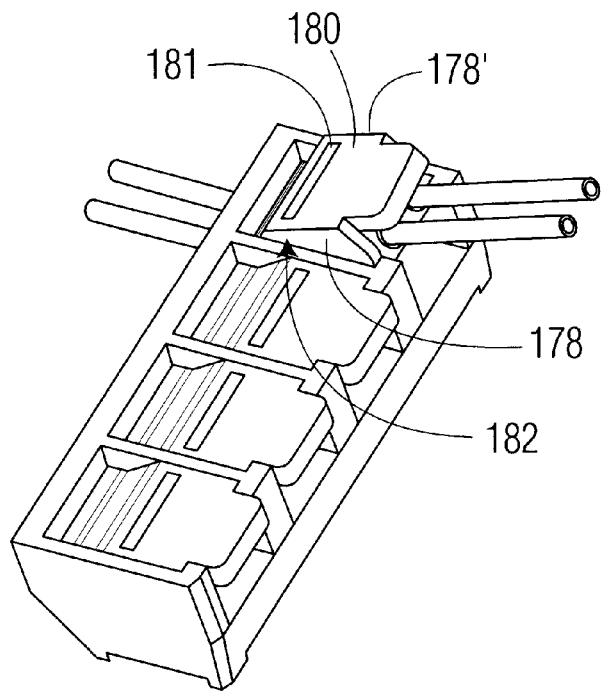
FIG. 7B is an isometric view of an IDC connector in which the inlet and outlet ports of an IDC connector are such as to direct the uncut lead parallel to the bottom of the associated junction box of the invention.
Figure 8A:
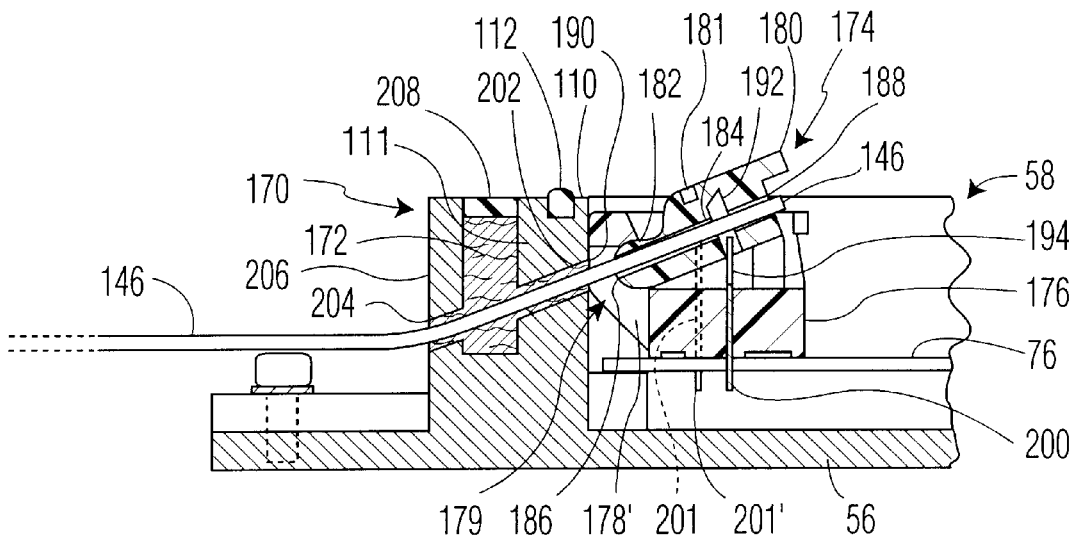
FIG. 8A is a partial cross-sectional view taken along 8A≦8A of FIG. 6 showing a chamber containing sealant and an open IDC connector in which the inlet and outlet ports are such that an uncut lead slants upwardly through the chamber.
Figure 8B:
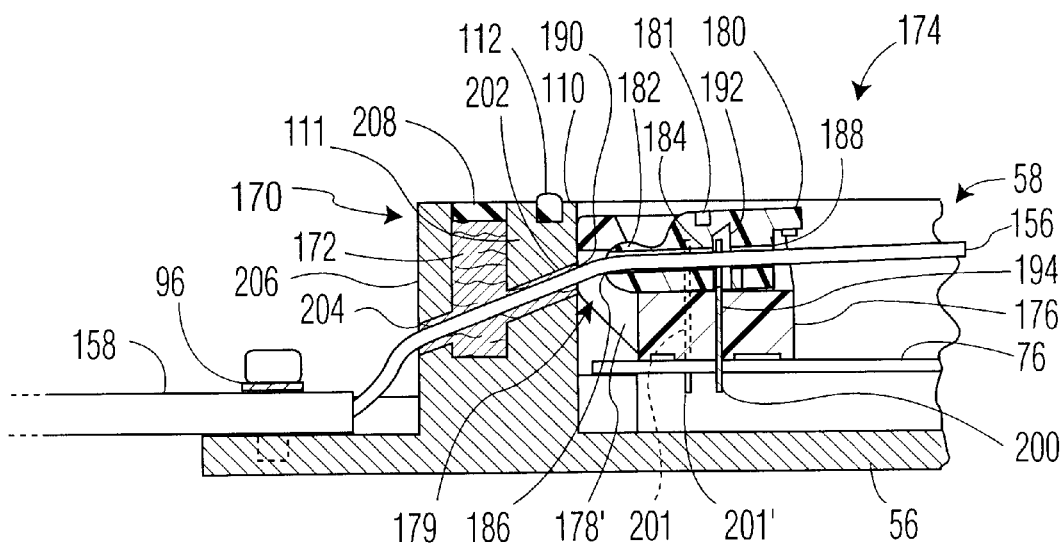
FIG. 8B is a partial cross-sectional view like taken along 8B—8B of FIG. 6 showing the position of a closed IDC connector making electrical connection through an insulated wire.
Figure 8C:
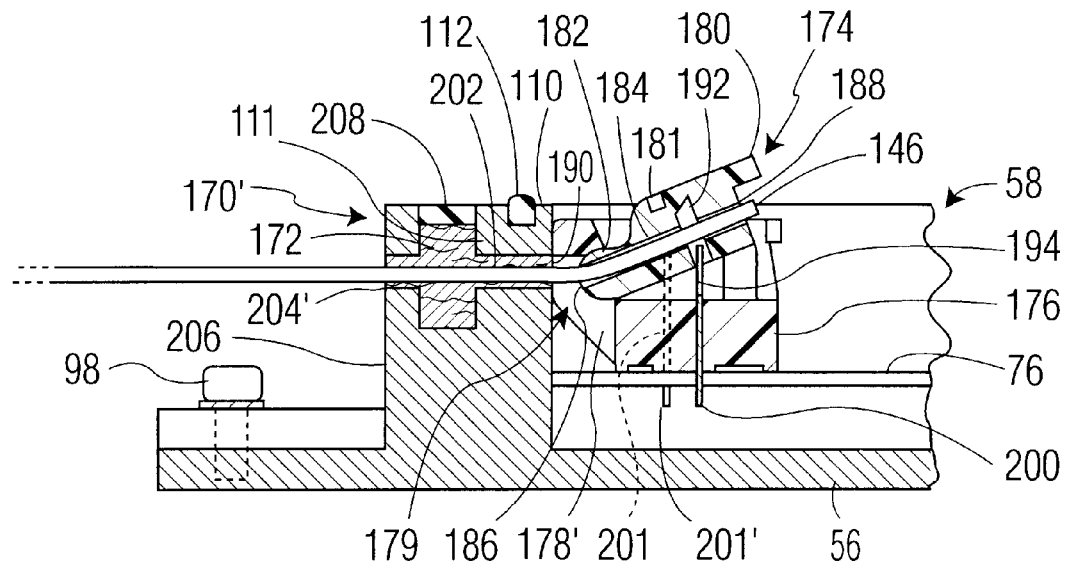
FIG. 8C is a partial cross-sectional view of a chamber containing sealant and an open IDC connector in which the leads pass perpendicularly through the chamber for another embodiment of the invention.
Figure 8D:
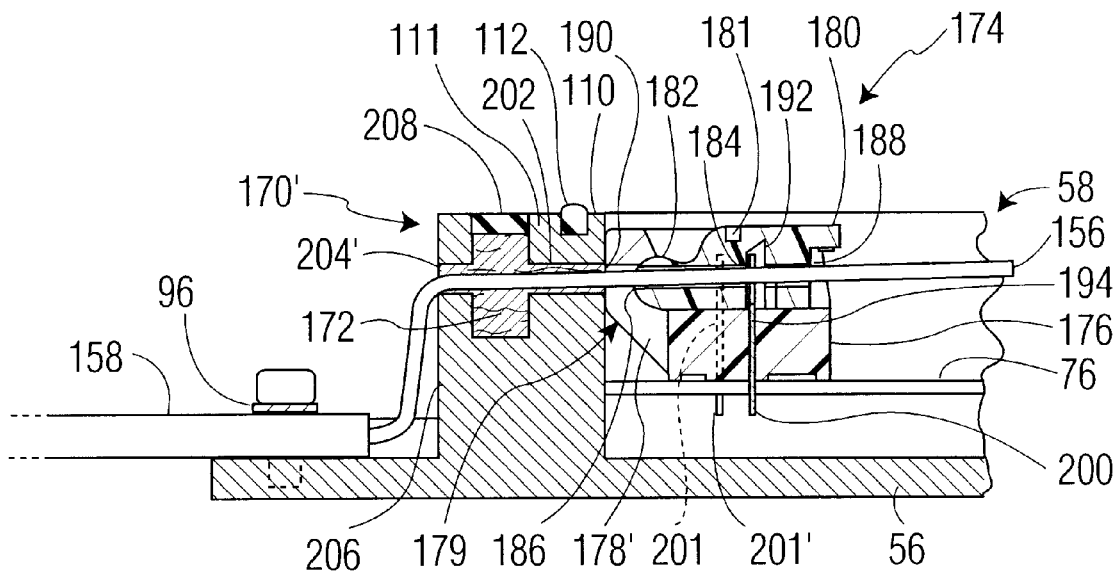
FIG. 8D is a partial cross-sectional view like that of FIG. 86C showing the position of a closed IDC connector making electrical connection through an insulated wire.

FIG. 7A is an external isometric view of the angles at which power leads are introduced into and leave an IDC when a chamber 170 shown in FIGS. 8A and 8B is used, and FIG. 7B is an external isometric view of the angles at which power leads are introduced into and leave an IDC when a chamber 170' of FIGS. 8C and 8D is used. Any of the chamber constructions and 170 of FIGS. 8A and 8D, 170' of FIGS. 8C and 8D, 170" of FIG. 8E can be used for the chambers 114 and 116 in FIGS. 2, 4, and 6, and an IDC connector 174 shown in FIGS. 8A, 8B, 8C, 8D, and 8E can be used for any of the IDC connectors 78, 80, 82, 84, 86, 88, 90, and 92 of FIGS. 2, 4, 6, 12, and 14. The chambers 170, 170', and 170" are filled with the sealant 172.

Figure 8E:
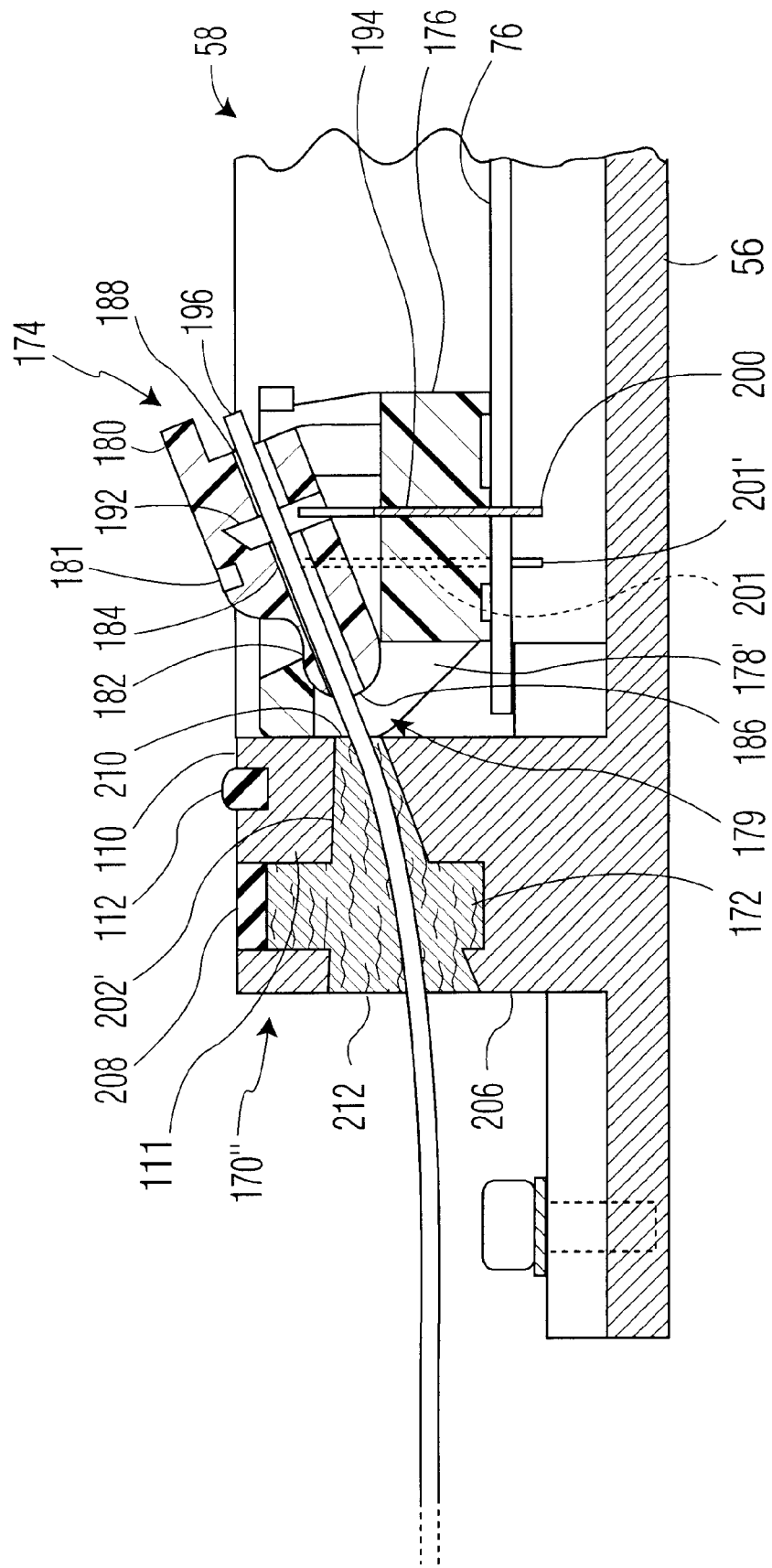
FIG. 8E is a partial cross-sectional view of a chamber containing sealant and an open IDC connector showing inlet and outlet openings in the channel shaped like funnels to aid in guiding an insulated wire through them.

The IDC connector 174 of FIGS. 8A, 8B, 8C, 8D, and 8E can be used for the IDC connectors 78 through 92. The IDC connector 174 of FIGS. 8A, 8C, and 8E is in an open position as would be seen in section 8A, 8A of FIG. 6, and the IDC connector 174 of FIGS. 8B and 8D is in a closed position as would be seen in section 8B, 8B of FIG. 6. In FIGS. 8A, 8B, 8C, 8D, and 8E, the IDC 174 is comprised of a base 176, a side wall 178 seen only in FIGS. 7A and 7B, an opposing parallel side wall 178', and a lever 180 pivoted at 182 to move in an opening 179 between the side walls 178 and 178'. A screwdriver slot 181 in the top of the lever 180 permits the lever 180 to be raised to an open position. A passageway 184 within the lever 180 passes from an inlet port 186 adjacent the pivot point 182 to an outlet port 188. An outlet port 190 in the side wall 111 communicates with the inlet port 186 when the lever 180 is in the raised position shown in FIGS. 8A and 8C. A slot 192 within the lever 180 is transverse to the passageway 184. A spade 194 of conductive material like the spades 6 and 8 of FIG. 1 that have one end U shaped as seen from the side is mounted in the base 176 so as to be in registration with the slot 192. When the lever 180 is lowered, as shown in FIGS. 8B and 8D, the spade 194 cuts through the insulation of a lead within the passageway 184 and makes electrical contact with its conductor. In FIGS. 8A and 8C, the lead 146 is seen, and in FIGS. 8B and 8D the lead 156 is seen.

The base 176 of the IDC 174 is mounted on the circuit board 76, and the other end 200 of the spade 194 serves as a terminal that can be connected to an AC power source in the circuit. A spade 201 shown in dotted lines because it is behind the plane of the cross-section cuts the insulation of the other insulated lead of a pair, not shown, to make contact with a terminal 201'.

FIG. 8A is a section 8A, 8A of FIG. 6 showing the insulated lead 146 just before it has been inserted far enough to pass beyond the outlet port 188 of the passageway 184 in the lever 180 of the IDC 82 when a chamber construction 170 is used. In a chamber construction 170, a passageway 202 passes completely through the wall 111 of compartment 56 and the outer wall 206 of the chamber 114 so as to connect the outlet port 190 to an opening 204 in the outer wall 206. The angle of the passageway 202 is such that it is aligned with the passageway 184 of the lever 180 when the lever 180 is up so as to make it easier to insert the lead 146. The same is true for the lead 144, which is not seen in this section.

FIG. 8B is a section 8B, 8B of FIG. 6, showing the insulated lead 156 that has been thrust entirely through the passageway 184 of the IDC 80. The lever 180 has been lowered so as to make the desired electrical connection between the conductor, not shown, of the lead 156 and the spade 194, but the lead 156 has not been cut. The same is true for the lead 154, which is not seen in this section. The clamp 96 is then tightened to hold the cable 158 in place, and the lead 156 is cut just outside the outlet port 188 so as to be like the lead 162 in the IDC 78.

FIGS. 8C and 8D correspond respectively to the FIGS. 8A and 8B except that a chamber construction 170' is used in which an opening 204' in the outer wall 206 is at the same height in the wall 111 as the outlet port 190 in the side wall 111 so that the passageway 202' makes an angle with the passageway 184 when the lever 180 is raised but is coaxial therewith when the lever 180 is lowered to make electrical contacts.

FIG. 8E is like FIG. 8A except that an opening 210 in the side wall 111 of the chamber 170", and an opening 212 in the outer wall 206 of the chamber 170" are connected by a funnel shaped passageway 202' so as to better guide a lead 196.

It is preferable to cover the top of the sealant 172 in the chambers 170, 170' and 170" with a layer 208 of rubber or the like that adheres to the sealant 172.

Figure 9A:
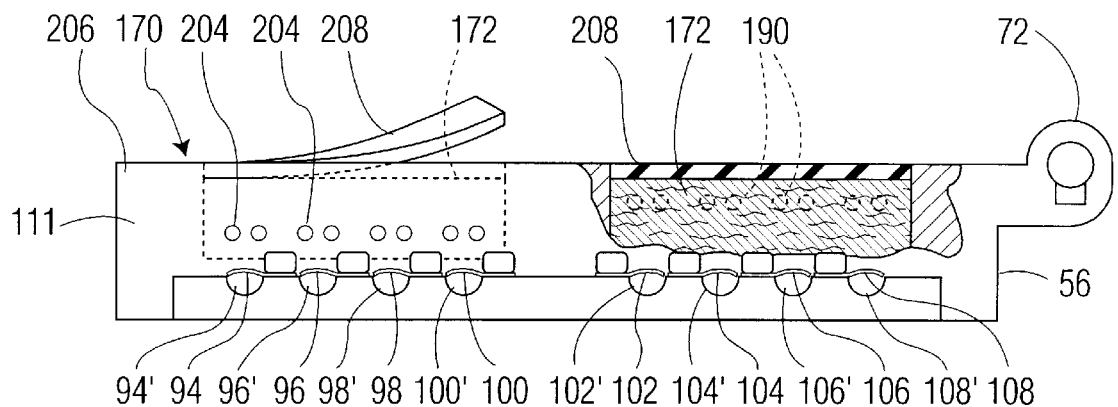
FIG. 9A is an outside and partial cross-sectional view showing a chamber of a multi-tap housing containing the sealant and further showing inlet openings of the chamber for the leads at positions corresponding to their positions in FIGS. 8A and 8B in accordance with an embodiment of the invention.

FIG. 9A is a front view of the compartment 56 of FIGS. 2, 3, 4, and 6 with the cover 64 removed when the sealing chamber 170 of FIGS. 8A and 8B is used and wherein respective pairs of inlet openings like 204 are immediately above the clamps 94, 96, 98, and 100. The positions of pairs of outlet openings like 190 are shown in the right half dashed lines because they are in the inner surface of the wall 111. The right half of FIG. 9A is in a partial cross-section showing the sealant 172 and the overlying rubber mat 208. Note that there are semi-circular grooves, 94', 96', 98', and 100' under the respective clamps 94, 96, 98, and 100 and semi-circular grooves 102', 104', 106', and 108' under the respective clamps 102, 104, 106, and 108 so as to provide a snug fit around a power cable when present.

Figure 9B:
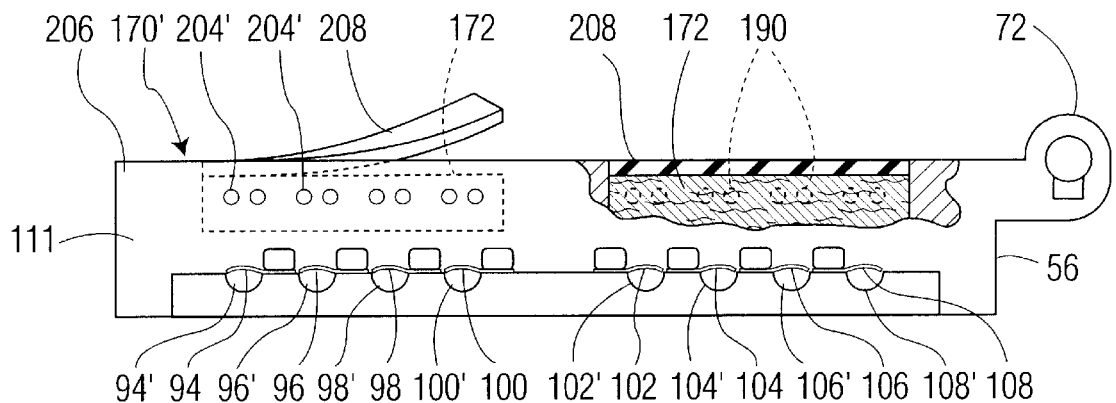
FIG. 9B is an outside and partial cross-sectional view showing a chamber of a multi-tap housing containing sealant and further showing inlet openings of the chamber for the leads at positions corresponding to FIGS. 8C and 8D.

FIG. 9B is the same as FIG. 9A except that the pairs of openings shown in its left half have locations like the opening 204' of FIGS. 8C and 8D that are spaced farther from the clamps 94, 96, 98, and 100.

Figure 10:
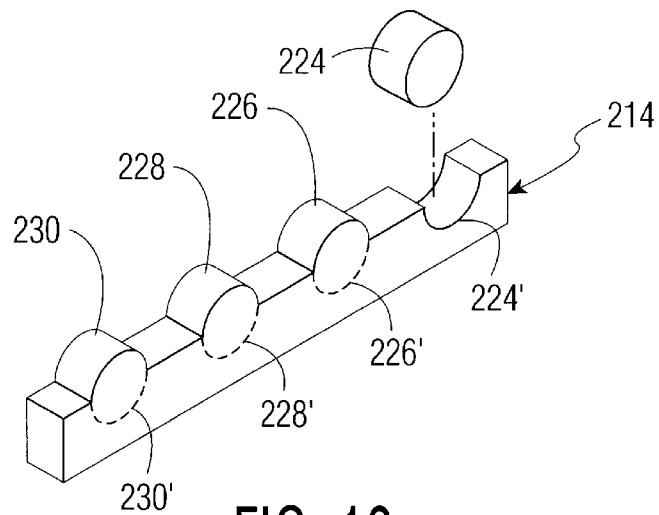
FIG. 10 is an isometric view of a gasket for closing off the outside of open slots of a multi-tap housing through which electrical cable passes to a chamber containing sealant when not in use.
Figure 11:
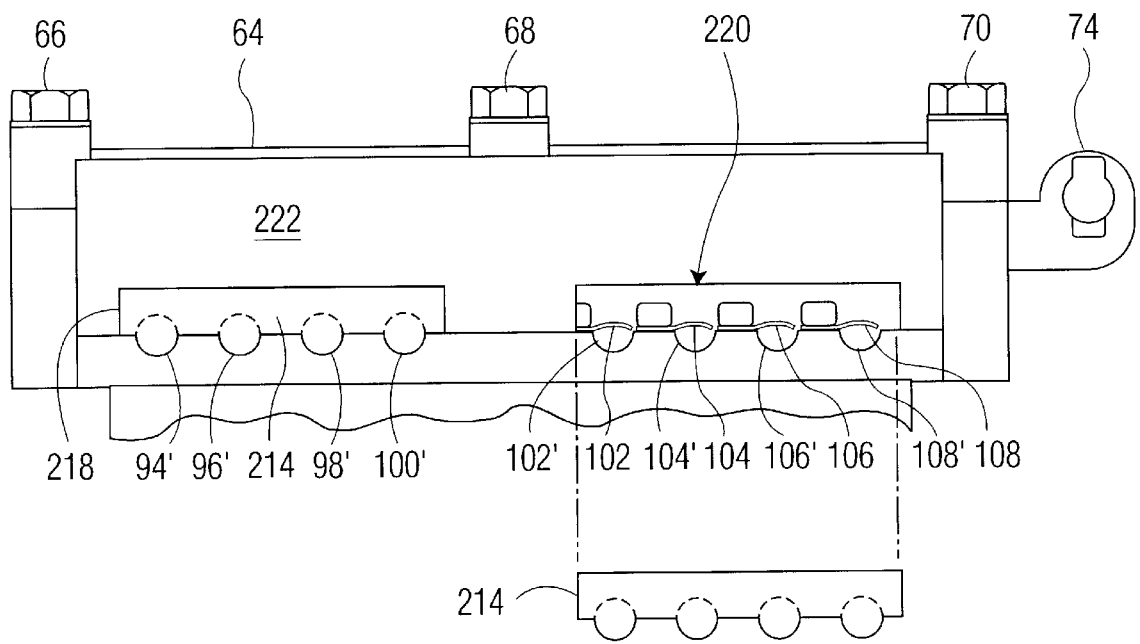
FIG. 11 is an outside view of a multi-tap housing illustrating use of the gasket of FIG. 10 for one embodiment of the invention.

In FIG. 11, a gasket 214 like that shown in FIG. 10 is permanently adhered in an opening 218 in a wall 222 that depends downwardly from the front of the cover 64 as also shown in FIG. 2 so that halves of cylindrical plugs 224, 226, 228, and 230 of FIG. 10 that are removably adhered to semi-circular grooves indicated by lines 224', 226', 228', and 230' fit into the grooves 94'–100'. When a power cable such as 128 of FIG. 5 is to be installed, a plug such as 224' of FIG. 10 is removed, and a power cable having the same diameter as the plug takes its place so that there are no leaks through the depending wall 222 to permit the entrance of moisture. In FIG. 11, a gasket 214 like that of FIG. 10 is displaced from the opening 220 in the wall 222 so as to reveal the grooves 102'–108' and the clamps 102–108 located behind them. The gasket 214 prevents dirt and insects from getting into the compartment 56.

Figure 12:
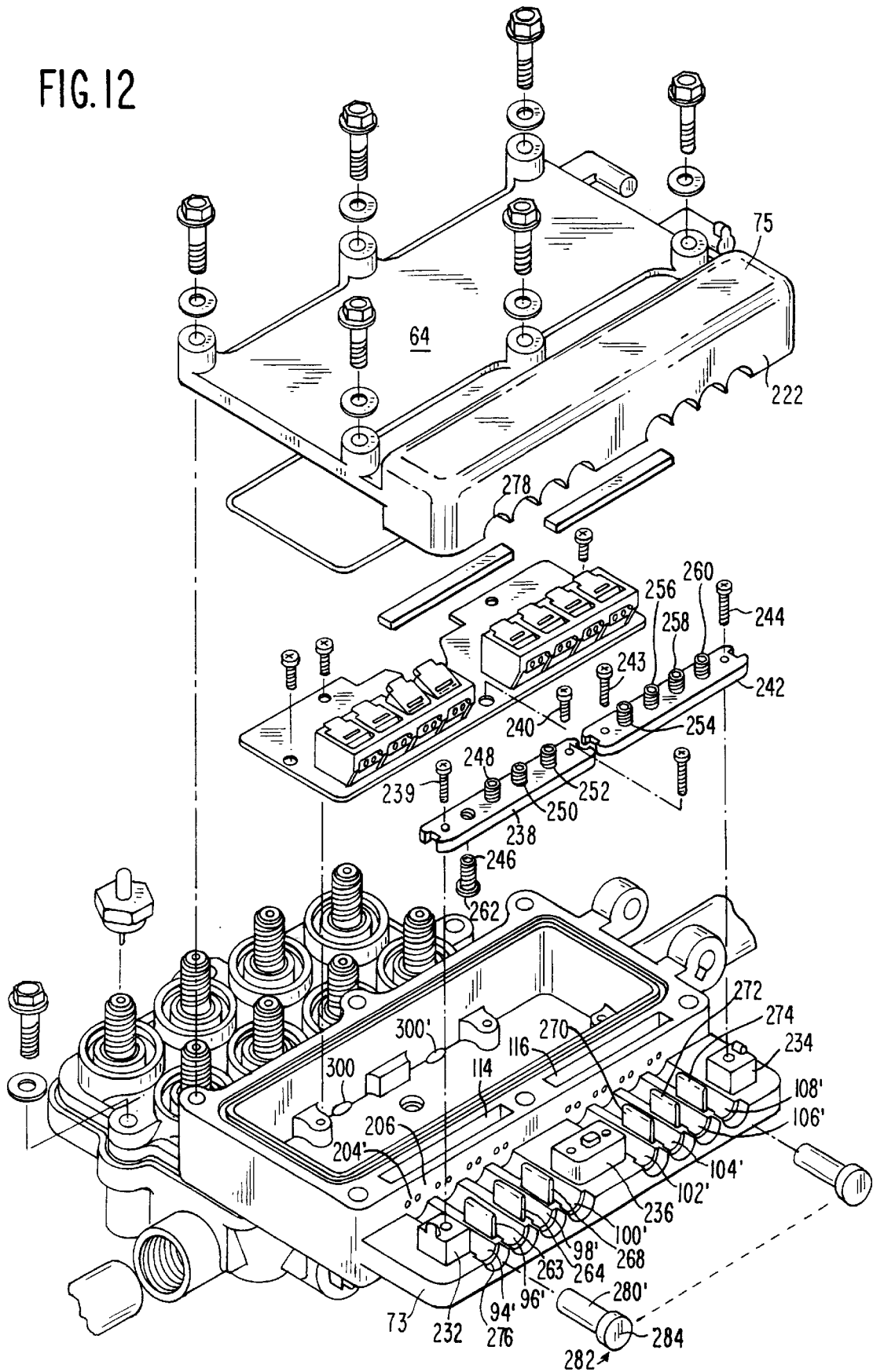
FIG. 12 is an exploded isometric view of a preferred embodiment of a multi-tap junction box of the invention.

FIG. 12 is an exploded isometric assembly drawing of a preferred form of a junction box of this invention that is like that of FIG. 2 except for the way in which the power cables like 128 of FIG. 5 are clamped into place and the manner in which the openings between the front wall 222 and the ledge 73 for receiving power cables when the cables are not present are sealed. Also, the mounting ledge 73 is elevated closer to the wire holes 204' to insure the power cables 158 are not bent but are retained in a straight configuration as shown in FIG. 15B, for example. Only the differences between FIG. 12 and FIG. 2 are now described.

In this preferred embodiment of the invention, lugs 232 and 234 are provided at opposite ends of the ledge 73, and a lug 236 is provided at its center. A plate 238 is fastened to the lugs 232 and 236 by screws 239 and 240, and a plate 242 is fastened to the lug 236 and the lug 234 by screws 243 and 244. Thus, the plate 238 passes over and is spaced from the grooves 94', 96', 98', and 100', and the plate 242 passes over and is spaced from the grooves 102', 104', 106', and 108' when assembled. Clamp bolts 246, 248, 250, and 252 are threaded through the plate 238 in respective registration with the grooves 94', 96', 98', and 100', and clamp bolts 254, 256, 258, and 260 are threaded through the plate 242 in respective registration with the grooves 102', 104', 106', and 108'. As illustrated by the bolt 246, each of the bolts 246 through 260 are indented at one end so as to receive an Allen® wrench or Philips® head or slot screw driver and have a head 262 at the other. Thus, when a power cable like 128 of FIG. 5 is inserted in any one of the grooves 94'–108', the corresponding bolt can be tightened so as to retain it in position.

Provision of a dirt and insect seal when a power cable is in a groove like 94' is accomplished in the following manner. The plate 238 comes in contact with the tops of fins 263, 264, and 266 that are respectively located between the groove pairs 94', 96'; 96', 98', and 98', 100', and the plate 242 comes in contact with the tops of fins 270, 272, and 274 that are respectively located between the groove pairs 102', 104'; 104', 106', and 106', 108'. The lug 232 servers as a fin at one side of the groove 94', the lug 234 serves as a fin for one side of the groove 108' and the lug 236 serves as fins for the grooves 100' and 102'. When a cable is mounted in a groove, its bolt is tightened and the insulation of the cable is compressed against the groove and the fins on either side to form a dirt and insect seal.

Dirt and insects are prevented from entering the space between the ledge 73 and the extension 75 when cables are not in the grooves 94'–108' in the following manner. Although only the outer end of the groove 94' is described, it is to be understood that the outer ends of all the other grooves 96'–108' will be constructed in the same way. The outer end of the groove 94' is enlarged so as to form a semi-circular ledge 276, and a matching semi-circular notch 278 is formed in the wall 222 of the projection 75 from the cover 64 so as to form a circular opening 276, 278 when the cover 64 is closed. When no cable is present in the groove 94', a cylindrical shank 280 of a resilient plug 282 is thrust through the opening, 276, 278, and along the groove 94' to the wall 206, thereby blocking the pair of openings 204' through which the leads of a cable are to be thrust. The diameter of the shank 280 is the same as the diameter of the groove 94'. When in this position, an enlarged head 284 of the plug 282 is diametrically compressed in the opening 276, 278 so as to prevent dirt and insects from entering the space between the ledge 73 and the extension 75.

When a plug like 282 is removed and a cable is inserted, further dirt and insect sealing is provided in the following manner. The cover 64 is opened, the plug 282 is removed, and a cable is placed into a groove like 94' with its insulated leads inserted in the openings 204', and when the cover 64 is closed, the semi-circular ledge 276 and the semi-circular notch 278 fit snugly around the cable so as to block dirt and insects from entering into the space between the ledge 73 and the extension 75.

Figure 13:
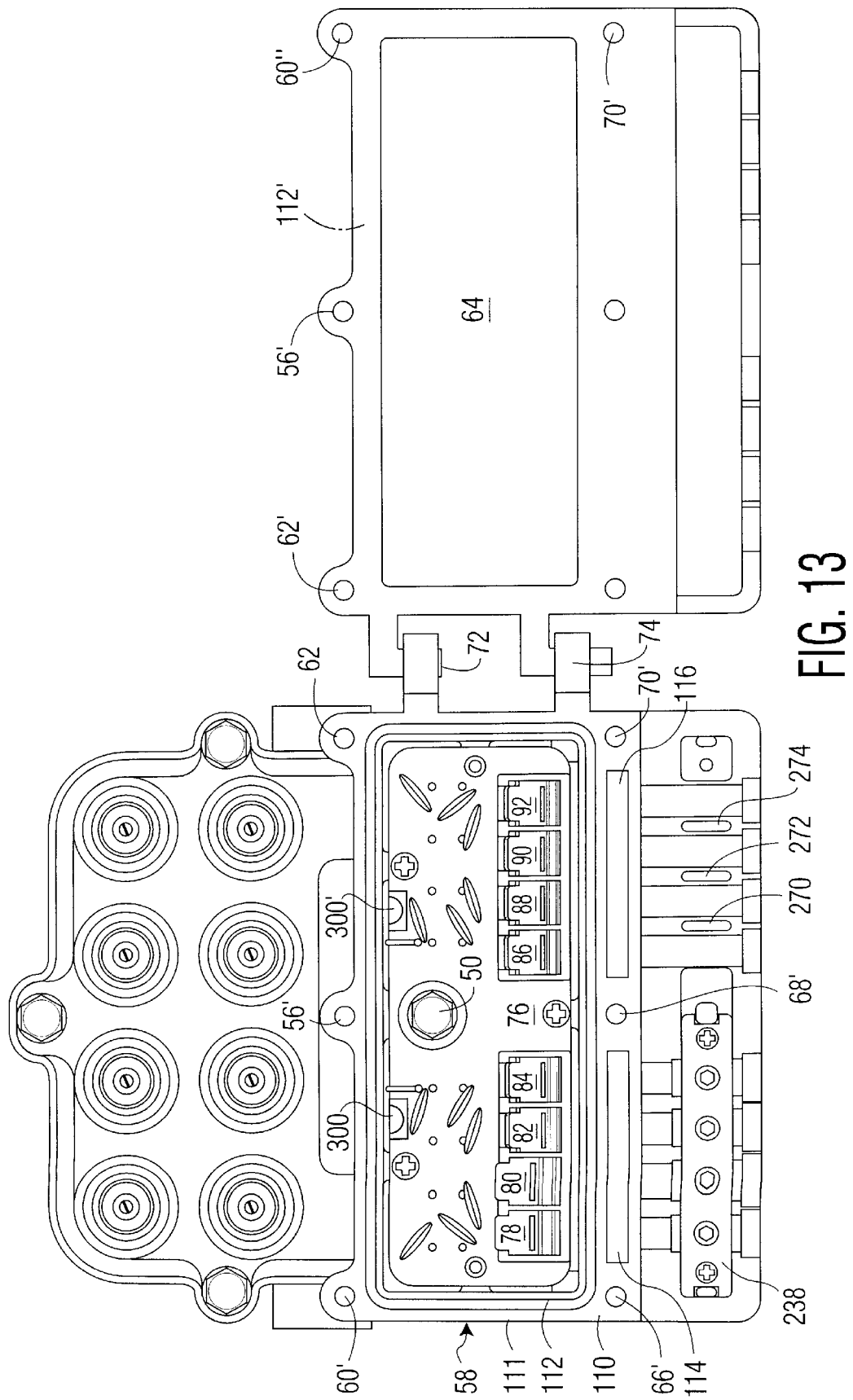
FIG. 13 is a bottom view of a junction box of FIG. 12 of the invention when assembled with its cover open.

FIG. 13 is the top view of the preferred junction box assembly of FIG. 12 with the cover 64 open. It is the same as FIG. 4 except for the means for clamping the power cables in position involving the use of the plate 238. The plate 242 is not shown so that the fins 270, 272, and 274 may be seen.

Figure 14:
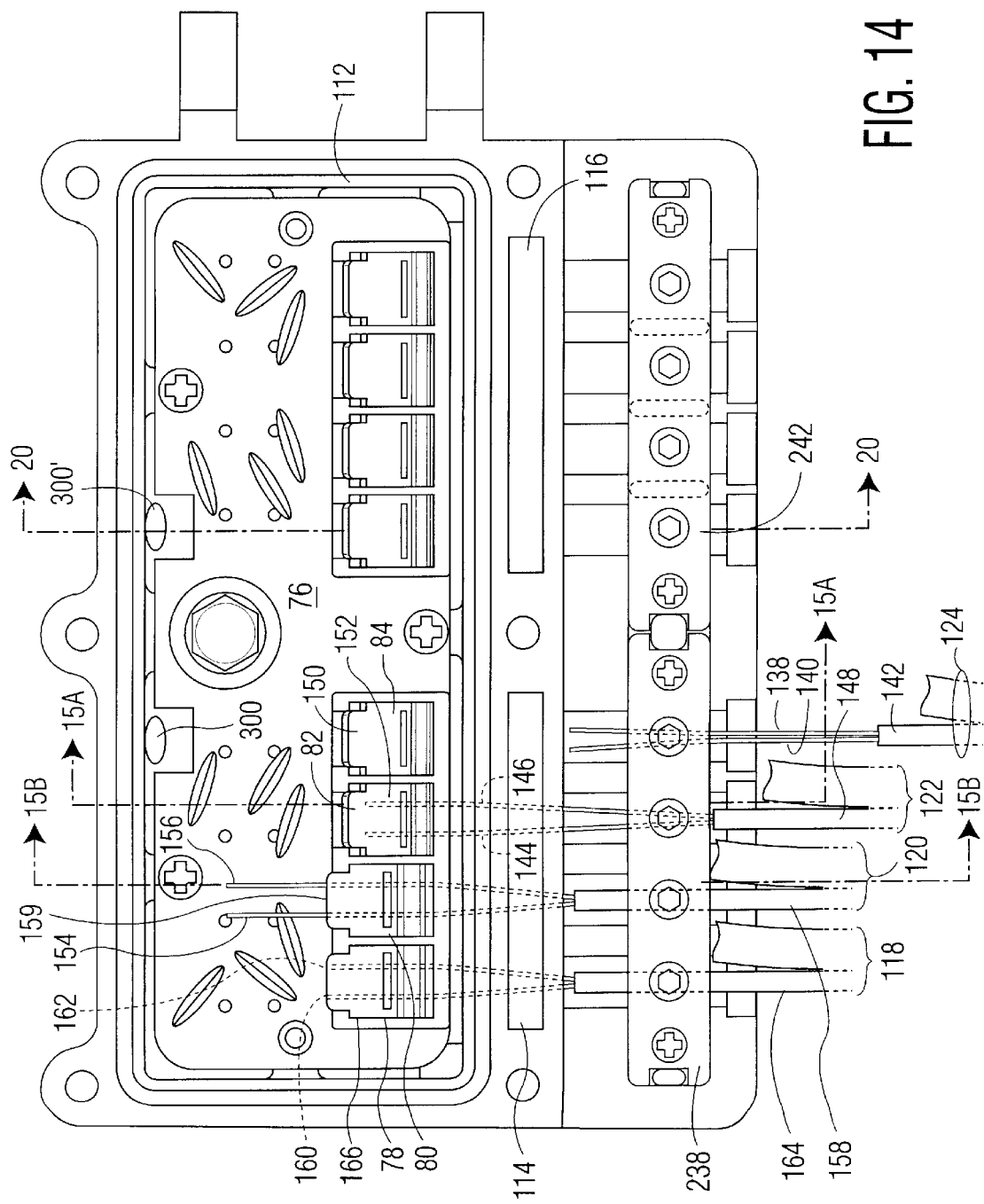
FIG. 14 is a view of a portion of the junction of FIG. 12 with the cover removed showing how cables and associated leads are connected to the junction box.

FIG. 14 is the top view of the preferred junction box assembly of FIG. 12 with the cover 64 removed and is the same as FIG. 6 except for the means for clamping the power cables into position involving the plates 238 and 242.

Figure 15A:
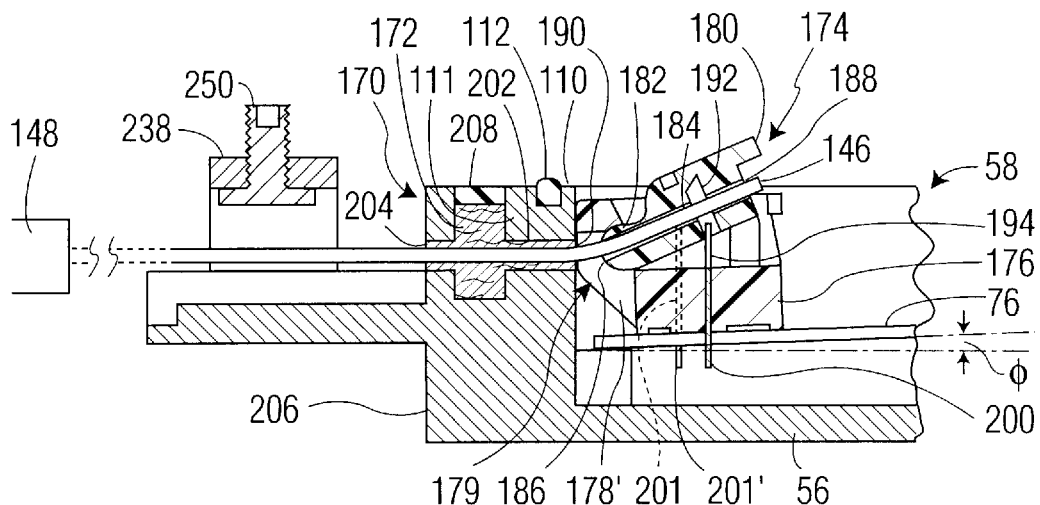
FIG. 15A is a partial cross-sectional view taken along 15A—15A of FIG. 14.
Figure 15B:
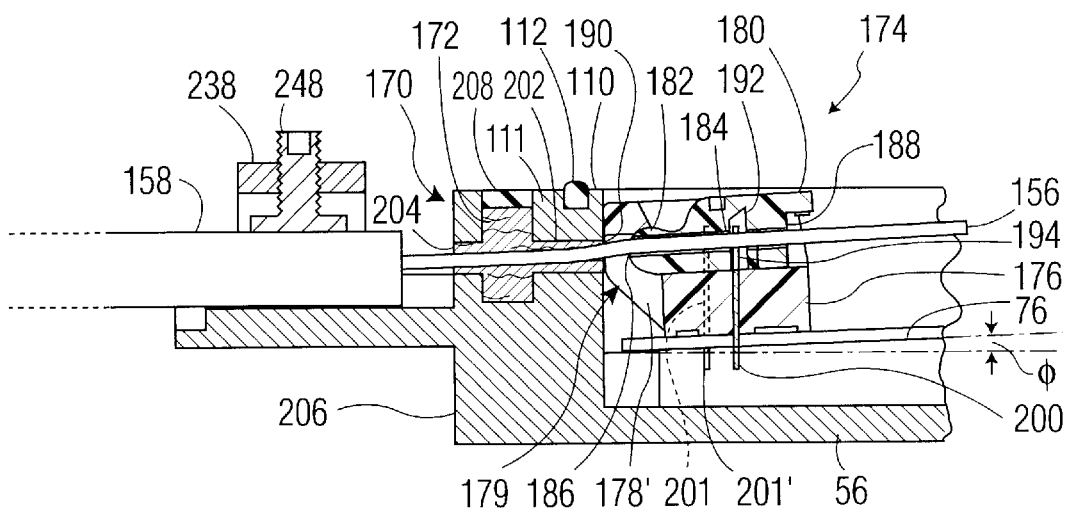
FIG. 15B is a partial cross-sectional taken along 15B—15B of FIG. 14.

FIG. 15A is a section 15A, 15A of FIG. 14 showing the IDC 82 in its open position. The details are the same as described in connection with FIGS. 8C and 8D. The clamp bolt 250 is shown in its raised position that permits the power cable 148 to pass under it. FIG. 15B is a section 15B, 15B of FIG. 14 showing the IDC 80 in a closed position just before the insulation of the lead 154 is cut. The power cable 158 is now clamped in position by the clamp bolt 250. In FIGS. 15A and 15B, the circuit board 76 is preferably slightly tilted as indicated.

Figure 16:
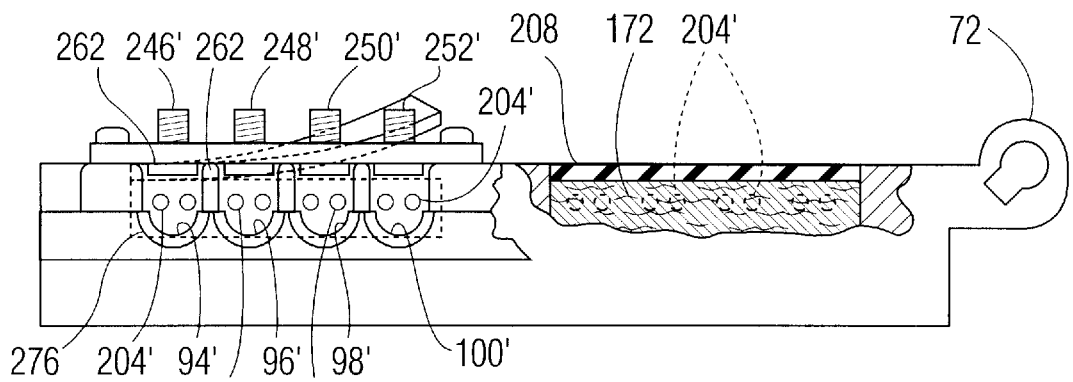
FIG. 16 is an outside and partial cross-section view of the multi-tap housing of FIG. 14.

FIG. 16 is a front view of the junction box assembly of FIG. 12 with its cover 64 removed so that the alignment of the semi-circular ledges like 276 with the semi-circular grooves 94'–100' and the openings 204' through which leads are thrust into the IDC's can be better seen. As in FIGS. 9A and 9B a partial section of the sealing chamber 116 is shown in which the positions of the openings 190 are shown in dashed lines.

Figure 17:
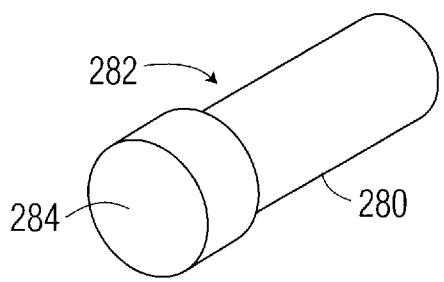
FIG. 17 is a pictorial view of a seal plug for the preferred embodiment of the invention of the multi-tap housing of FIG. 12.
Figure 18:
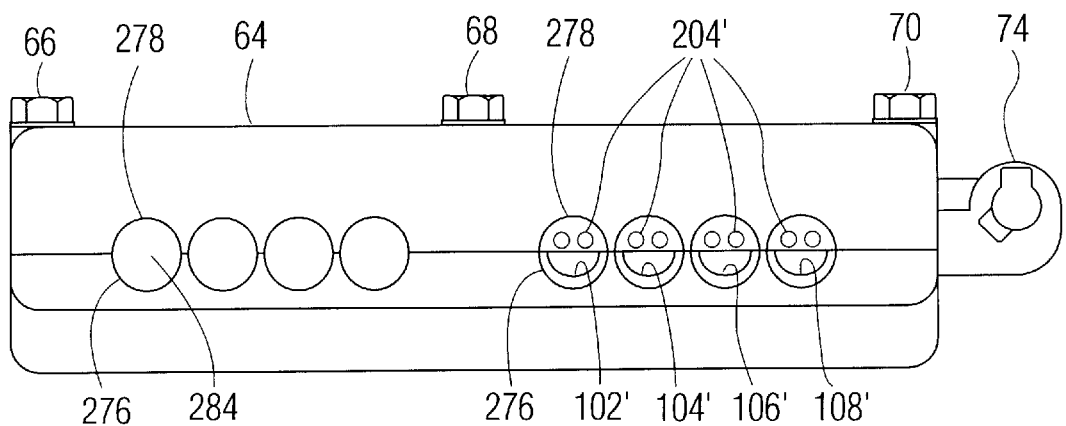
FIG. 18 is an elevational view of a side of the multi-tap housing of FIG. 12 showing some of the plugs of FIG. 17 installed therein.

FIG. 17 is a larger view of the plug 282 of FIG. 12, and FIG. 18 shows the front view of the junction box assembly of FIG. 12 with the cover 64 closed and plugs like plug 282 of FIG. 17 inserted through openings like 276, 278, and along the semi-circular groves 94'–100' that are not seen because of the heads 284 of the plugs. No plugs are inserted along the semi-circular grooves 102'–108' so that the openings defined by a semi-circular groove such as 276 and a notch such as 278 are clearly seen.

Figure 19:
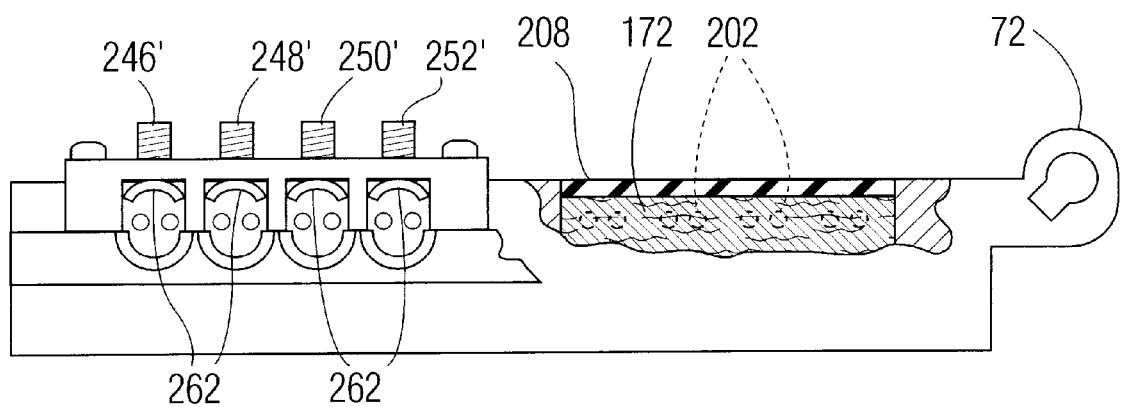
FIG. 19 is an elevational and partial cross-sectional view of the embodiment of the invention of FIG. 12 incorporating an illustrative embodiment for the cable clamping mechanism.

FIG. 19 is a view like that of FIG. 16 but differs therefrom in that bolts 246', 248', 250', and 252' differ from the bolts 246, 248, 250, and 252 of FIG. 16 by having curved heads 262', that are swivelled so as to obtain a tighter grip on a power cable. This is the preferred form of bolt that may be used in FIG. 12, for example.

In FIG. 14, the ends of two passageways or through holes 300 and 300'(also see FIG. 13) are visible through notches in the circuit board 76. FIG. 20 is a cross-section 20, 20 through one of them, but a similar cross-section of the other would be the same. As can be seen in FIG. 20, the passageway 300 extends from the compartment 56 to the compartment 26 and contains a filter 302 in accordance with an aspect of this invention. The purpose of the filter 302 is to prevent high frequencies present in the compartment 26 from entering the compartment 56 while at the same time permitting the low frequency that is used for power to pass from the compartment 26 to the compartment 56.

A terminal 304a of the filter 302 is in the compartment 56, and although not shown, is connected to an appropriate point in the circuit board 76. As previously explained, the circuit of the circuit board 76 connects low frequency voltage from the filter 302 to the IDC's in the compartment 56. Adjacent the terminal 304a is a capacitor C1. A terminal 304b at the other end of the filter 302 extends into the compartment 26. Adjacent the terminal 304b is a capacitor C2.

Figure 22:
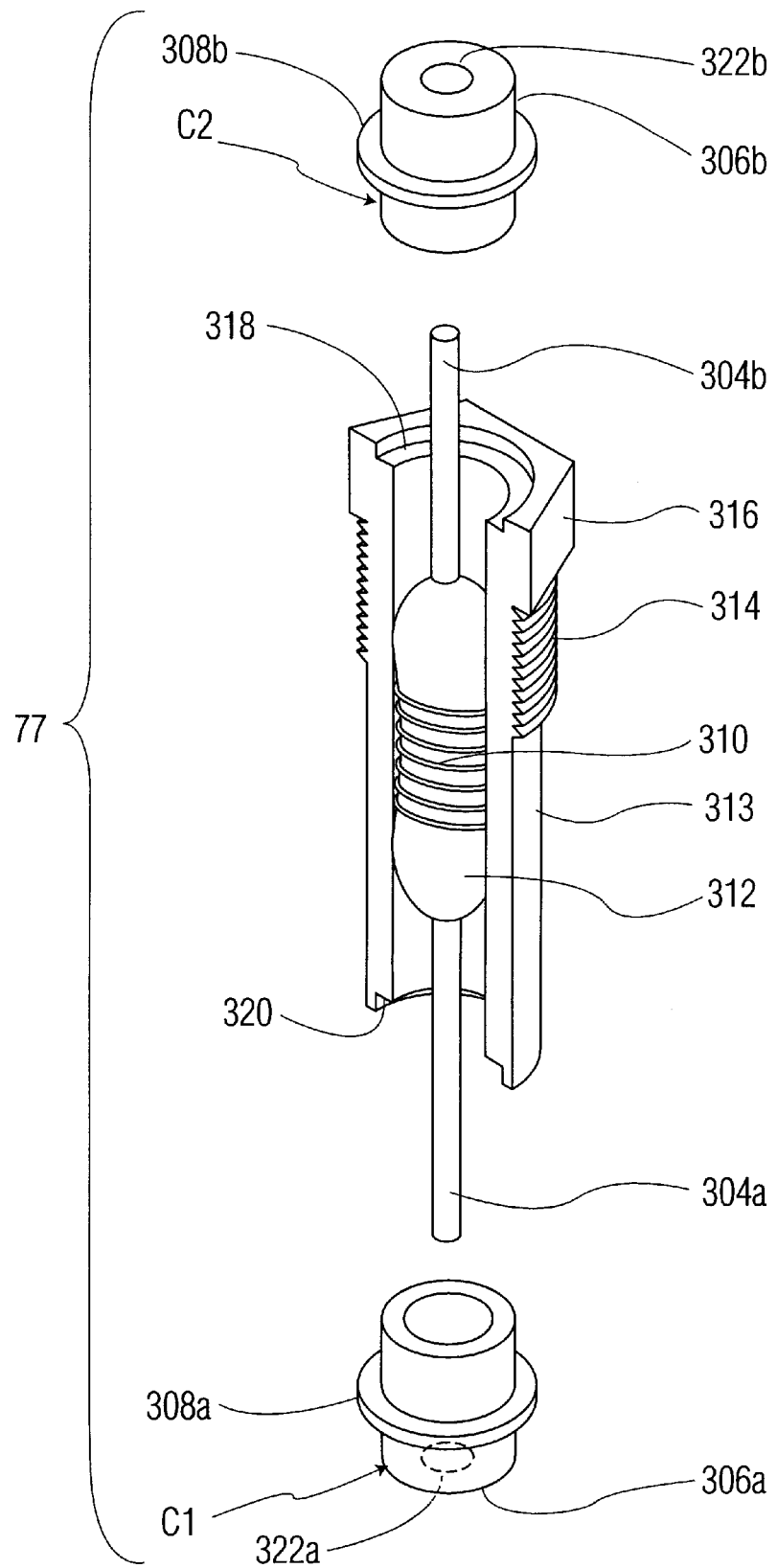
FIG. 22 is an exploded partly cut away view of a low pass filter of this invention.

The capacitors C1 and C2 are preferably of the ceramic feed through type. As shown in FIG. 22, the capacitor C1 is comprised of a ceramic cylinder 306a having a metal annulus 308a mounted around its center. The corresponding parts of the capacitor C2 are designated by the same number with a subscript b.

Figure 23:
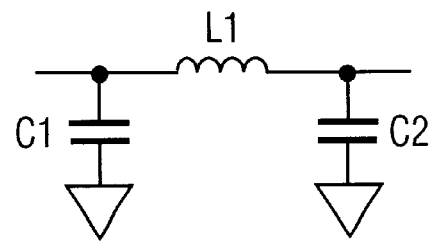
FIG. 23 is schematic diagram of one circuit for low pass filter of this invention.

As shown in the schematic circuit of the filter 302 shown in FIG. 23, one side of each of the capacitor C1 and C2 is connected to ground and an inductor L1 is connected between their other sides to form a n filter that passes low frequencies and attenuates high frequencies.

As shown in FIG. 22, the inductor L1 is formed by winding an insulated wire 310 around a body 312 having the terminals 304a and 304b embedded in opposite ends thereof. Although not shown, one end of the wire 310 is connected to the terminal 304a, and the other end is connected to the terminal 304b.

The structure just described is mounted within a metal cylinder 313 having external threads 314 adjacent a nut shaped portion 316 at one end. An annular shelf 318 is formed within the outer end of the nut 316, and an annular shelf 320 is formed within the other end of the cylinder 313. Note that the cross-section of the body 312 is reduced where the insulated wire 310 is located so as to form a space between the wire 310 and the cylinder 313 for the purpose of providing better insulation between them.

Figure 21:
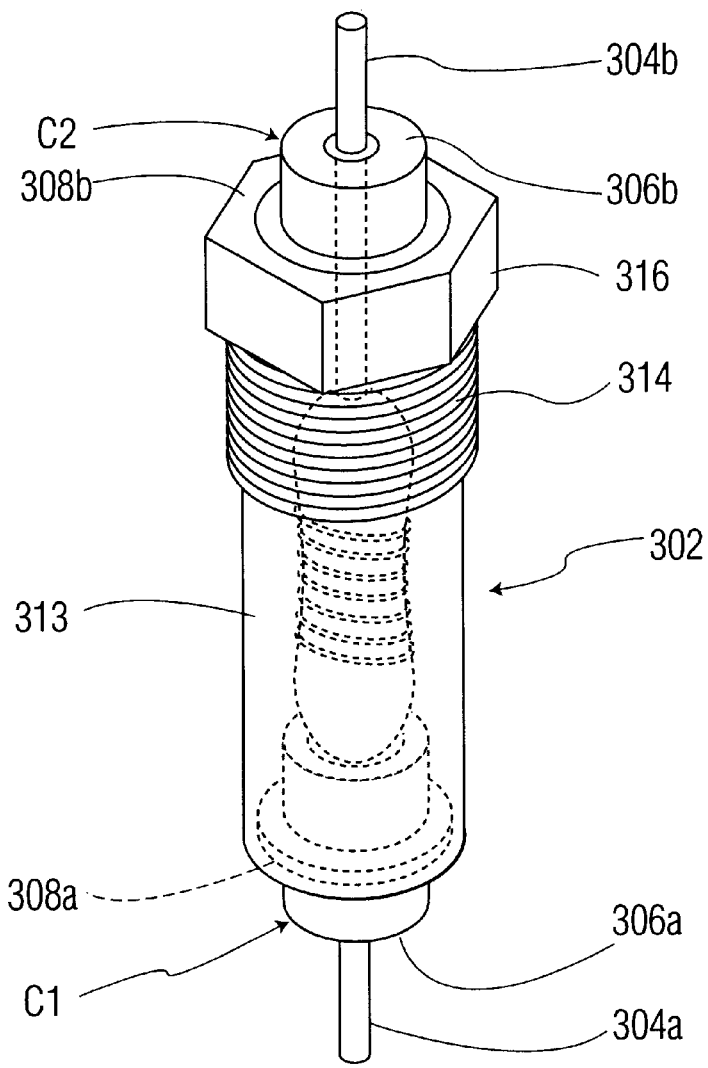
FIG. 21 is an external view of a low pass filter of this invention.

When the components of FIG. 22 are assembled as shown in FIG. 21, the terminals 304a and 304b are respectively inserted the longitudinal openings 322a and 322b within the ceramic cylinders 306a and 306b. The annulus 308a is nested in the annular shelf 320 and soldered thereto, and the annulus 308b is nested in the annular shelf 318 and soldered thereto. The terminal 304a is soldered to the opening 322a, and the terminal 304b is soldered to the opening 322b.

Figure 20:
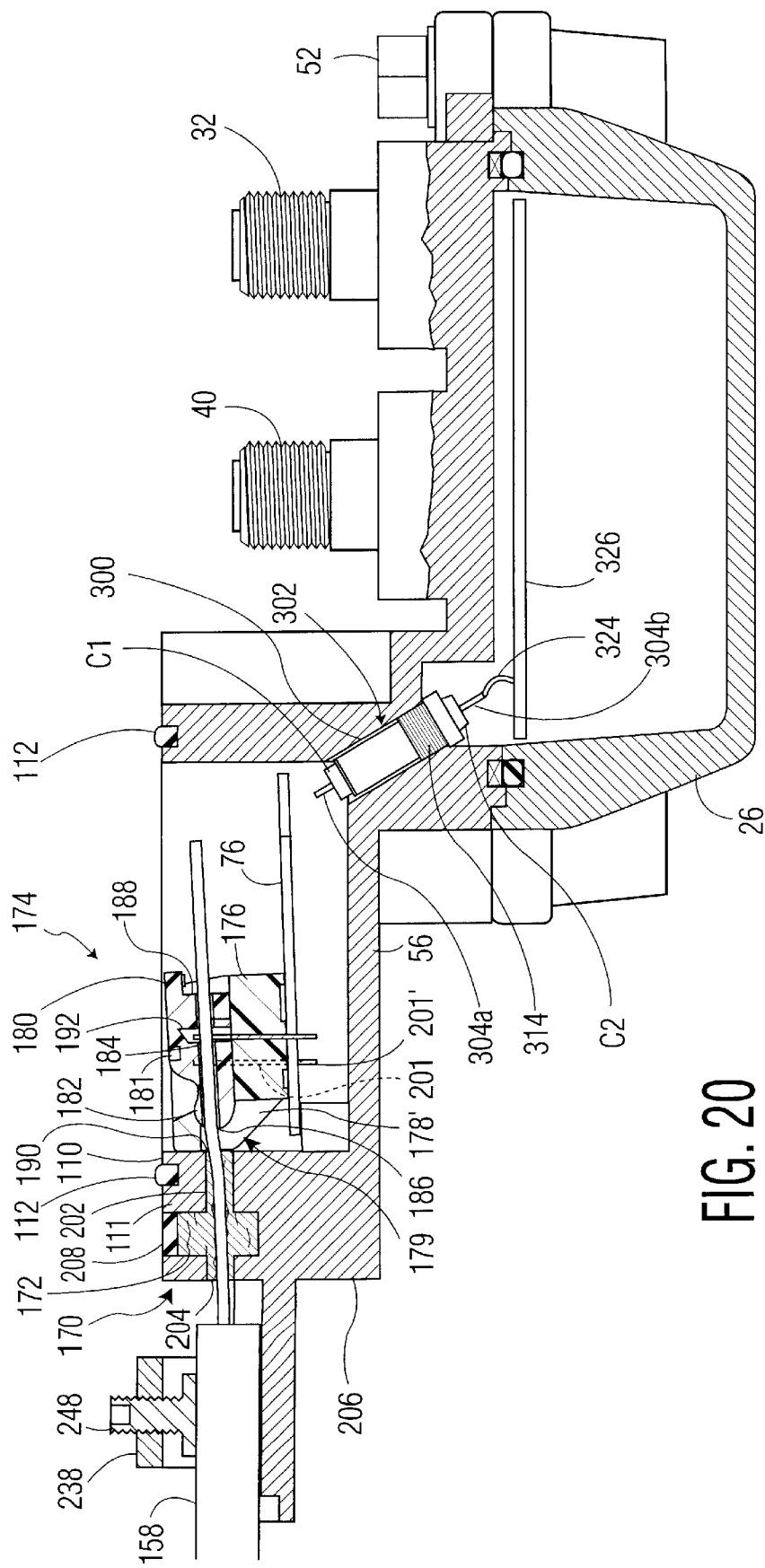
FIG. 20 is a cross-section 20, 20 of FIG. 14.

As shown in FIG. 20, the filter 302 is mounted within the passageway 300 by screwing the threads 314 into mating threads, not shown, in one end of the passageway 300 with the aid of the nut 316. A connection, not shown, is made between the terminal 304a and an appropriate point in the circuit on the circuit board 76, and a connection, 324 is made between the terminal 304b and an appropriate point in a circuit on a circuit board 326. The circuit board 326 couples the coaxial port 24 at one end of the compartment 26 to the coax connector 46 (see FIG. 3) at the other end. Note passageways 300 and 300' are preferably circular.

In accordance with an aspect of this invention, it is important that the capacitors C1 and C2 be respectively connected to the metal of the compartments 56 and 26, i.e. at the ends of the metal passageway 300. Stating this in another way, the filter 302 must be mounted between the compartments 26 and 56. RF energy in the compartment 26 would be picked up directly by the wire 304b, but it is immediately shorted to ground by C2, and since the inductor winding 310 is completely enclosed in the cylinder 313, no r.f. energy can be picked up by the winding. The r.f energy is attenuated by the filter between its input 304b and its output 304a. Similarly, any r.f. radiation signal picked up or existing in the compartment 56 will not be conveyed to the compartment 26. This structure overcomes the problem encountered in the prior art wherein the unshielded inductor of the filter is exposed to at least one compartment thereby creating a situation where r.f. energy picked up by the inductor in one compartment is passed into the other compartment. The present invention insures that the filter blocks such high-frequency r.f. energy flow, passing only low-frequency power.

It will be apparent to those skilled in the art that a low pass filter having a schematic circuit of a different configuration from that shown in FIG. 23 could be use, but it has to have an input in the inner surface of one compartment and an output in the inner surface of other compartment so that high frequency signals from one compartment are attenuated by the entire filter before reaching the other compartment.

Although various embodiments of the present invention have been shown and described herein, they are not meant to be limiting. Those of skill in the art may recognize certain modifications to these embodiments, which modifications are meant to be covered by spirit and scope of the appended claims.

What is claimed is:

1. A chamber construction for providing a hermetic seal for leads passing therethrough comprising:

a chamber having first and second opposed spaced integral walls, a bottom and opposing end walls, said first and second walls having inside surfaces facing each other;

means defining passageways extending through said first and second walls for receiving said leads; and an insulating, self-healing and self-supporting sealant within said chamber for providing said hermetic seal.

2. A structure as set forth in claim 1, wherein the sealant is a gel material.

3. A chamber construction as set forth in claim 1, wherein said means defining passageways includes funnel shaped passageways extending through an outer to an inner surface of said first and second wall, so as to aid in guiding a lead through them.

4. A chamber construction as set forth in claim 1, further comprising:

a layer of moisture impervious material in contact with a top surface of said sealant.

5. An electrical junction box as set forth in claim 1, wherein said sealant consists of a gel material.

6. A electrical junction box as set forth in claim 1 wherein said gel is self-healing and self-supporting.

7. An electrical junction box comprising:

a compartment having a bottom, a side wall extending from said bottom, said side wall having an outer surface and an inner surface;

a removeable cover for said compartment;

a gasket for sealing said cover to said side wall;

means defining a chamber adjacent a portion of the outer surface of said side wall, said chamber including an outer wall spaced from said side wall;

a plurality of passageways through said inner and outer surfaces of said side wall for permitting electrically insulated wires to pass through, respectively;

a plurality of passageways through inner and outer surfaces of said outer wall for permitting electrically insulated wires to pass through to opposing one's of said plurality of passageways through said side wall, respectively, for passing said wires into said compartment;

an IDC having passageways therein and inlet ports and outlet ports for said passageways;

means for mounting said IDC within said compartment so that the inlet ports of its passageways are in registration with said passages of said side wall, respectively;

electrical terminals mounted in said compartment;

said IDC having means for respectively electrically connecting insulated wires inserted through said plurality of passageways to said electrical terminals when activated; and an insulating gel within said chamber to hermetically seal said junction box about areas where said insulated wires pass through said outer wall and said side wall.

8. An electrical junction box as set forth in claim 7, further comprising a layer of moisture impervious material mounted in contact with a top surface of said sealant.

9. An electrical junction box as set forth in claim 7, wherein the passageways in said side wall of said junction box and the passageways in said IDC are aligned when said IDC is in an open condition for receiving an insulated conductor.

\* \* \* \* \*